United States Patent
Lee et al.

(10) Patent No.: US 11,193,970 B2
(45) Date of Patent: Dec. 7, 2021

(54) TEST CHAMBER AND TEST APPARATUS HAVING THE SAME

(71) Applicant: Samsung Electronics Co., Ltd., Suwon-si (KR)

(72) Inventors: Seon-Mi Lee, Asan-si (KR); Sung Jin Kim, Daejeon (KR); Ja-Hwan Ku, Cheonan-si (KR); Jae-Hyun Kim, Hwaseong-si (KR); Gilho Lee, Daejeon (KR); Dahm Yu, Daejeon (KR); Jonghyun Lim, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 161 days.

(21) Appl. No.: 16/561,741

(22) Filed: Sep. 5, 2019

(65) Prior Publication Data
US 2020/0271715 A1    Aug. 27, 2020

(30) Foreign Application Priority Data
Feb. 22, 2019   (KR) .......................... 10-2019-0021239

(51) Int. Cl.
*G01R 31/26*   (2020.01)

(52) U.S. Cl.
CPC ................................ *G01R 31/2642* (2013.01)

(58) Field of Classification Search
CPC ............................................... G01R 31/2642
See application file for complete search history.

(56) References Cited

U.S. PATENT DOCUMENTS

| | | | |
|---|---|---|---|
| 5,147,136 A | 9/1992 | Hartley et al. | |
| 6,239,396 B1 * | 5/2001 | Kang ...................... | B07C 5/344 209/573 |
| 8,875,528 B2 | 11/2014 | Immink et al. | |

(Continued)

FOREIGN PATENT DOCUMENTS

| JP | 2000-0065896 A | 3/2000 |
|---|---|---|
| JP | 2006-0308368 A | 11/2006 |

(Continued)

OTHER PUBLICATIONS

KR 10-1823865 English Translation (Year: 2018).*

*Primary Examiner* — Paresh Patel
(74) *Attorney, Agent, or Firm* — Muir Patent Law, PLLC

(57) ABSTRACT

Disclosed are a test chamber and a test apparatus having the same. The test chamber includes a test compartment configured to support a plurality of test boards, each being configured to secure a test object. The test chamber applies a test signal to the test object. The test chamber includes an inlet side and a discharge side, and a supply duct vertically extending along a height of the test compartment. The supply duct supplies the inlet side of the test compartment with the test fluid. The test chamber includes a fluid controller to uniformly control a distribution of a test fluid in the supply duct and uniformly supply the test compartment with the test fluid. The disclosed test chamber and test apparatus provide a uniform test temperature and thereby improve a test reliability of a test object such as a semiconductor or semiconductor package.

20 Claims, 6 Drawing Sheets

(56) References Cited

U.S. PATENT DOCUMENTS

2003/0112025 A1\* 6/2003 Hamilton ........... G01R 31/2862
324/750.14
2016/0139198 A1 5/2016 Park et al.

FOREIGN PATENT DOCUMENTS

| KR | 10-2010-0106379 A | 10/2010 |
|---|---|---|
| KR | 10-2016-0059691 A | 5/2016 |
| KR | 10-1823865 B1 | 3/2018 |

\* cited by examiner

TEST CHAMBER AND TEST APPARATUS HAVING THE SAME

CROSS-REFERENCE TO RELATED APPLICATIONS

This application claims priority under 35 U.S.C. § 119 to Korean Patent Application No. 10-2019-0021239, filed on Feb. 22, 2019 in the Korean Intellectual Property Office, the disclosure of which is incorporated by reference herein in its entirety.

BACKGROUND

1. Field

Example embodiments relate to a test chamber and a test apparatus having the same, and more particularly, to a burn-in test chamber for conducting a burn-in test to semiconductor package(s) and a test apparatus having the burn-in test chamber.

2. Description of the Related Art

A reliability test for a semiconductor package or semiconductor packages is usually conducted by a series of an electrical test and a burn-in test.

An electrical test usually examines the causes that contribute to the breaking down of wires during the normal operation of a semiconductor package or semiconductor packages by applying direct electrical current to the semiconductor packages. The burn-in test usually examines various causes that contribute to malfunctions of semiconductor package(s) under extreme conditions that deviate from the normal operation conditions.

In conventional burn-in tests, a semiconductor packages under test ("SUT") is loaded into a test chamber and a sufficiently hot or a sufficiently cold test fluid is circulated in the test chamber in such a way that the SUT sufficiently undergoes thermal stresses in the test chamber.

For example, when hot air is supplied into the test chamber for the burn-in test, the hot air flows downwards in a supply duct that is arranged at a side of the test chamber. Thus, the hot air is predominantly distributed at a bottom portion of the supply duct rather than at a top portion of the supply duct due to inertia. Thus, the amount of the hot air is in a skewed distribution toward the bottom portion of the supply duct. The skewed distribution of the hot air causes a speed deviation of the hot air along the height of the test chamber. The hot air is supplied into the test chamber from the supply duct, so the upper portion of the hot air in the supply duct is supplied into an upper portion of the test chamber at a relatively low speed due to a relatively low pressure of the hot air. The lower portion of the hot air in the supply duct is supplied into a lower portion of the test chamber at a relatively high speed due to a relatively high pressure of the hot air. That is, the skewed distribution of the air in the supply duct may cause the inlet speed deviation of air in the test chamber.

The speed with which hot air contacts the SUT may impact the surface temperature of the SUT, thus a technical problem may exist, in which the test temperatures of the SUTs vary along the height of the test chamber. For example, the test temperatures of the SUTs at the upper portion of the test chamber are different from those at the lower portion of the test chamber, which may adversely impact the test accuracy of the burn-in test. The temperature uniformity in the test chamber is necessarily required for the test reliability.

An additional problem occurs when the hot air flows around the SUT. For example, the larger the void space around the SUT in the test chamber the greater the likelihood that the hot air will flow around the SUT and the smaller the likelihood the hot air flows on the SUT. Thus, as the void space around the SUT becomes larger, the test efficiency to the SUT becomes reduced in the test chamber. In most instances, the air flow in the void space around the SUT cannot be controlled during the burn-in test and the behavior of hot air in the void space cannot be analyzed and simulated for the burn-in test. Therefore, relatively large amounts of air in the void space usually deteriorate and/or adversely impact the test reliability of the burn-in test.

Accordingly, there is a desire to: (1) reduce the speed deviation of a test fluid, (2) reduce the temperature deviation of the SUT, and (3) minimize the void space around the SUT in the test chamber in order to provide a high test reliability of the burn-in test.

SUMMARY

Example embodiments of the present inventive concept provide a test chamber having a fluid controller for improving the flow uniformity to thereby improve the uniformity of the flow speed and the test temperature with minimized void space around the SUTs.

Other example embodiments of the present inventive concept provide a test apparatus having the above test chamber.

According to exemplary embodiments of the inventive concept, there is provided a test chamber that includes a test compartment configured to support and arrange a plurality of test boards. Each of the test boards is configured to secure a test object, such as a semiconductor package(s), and receive a test signal. Additionally, the test compartment has an inlet side and a discharge side that is opposite the inlet side and a supply duct that vertically extends in a first direction along a height of the test compartment. The supply duct is configured to supply the inlet side of the test compartment with a test fluid. Additionally, a fluid controller is provided that is configured to uniformly control distribution of the test fluid in the supply duct and uniformly supply the test compartment with the test fluid.

According to exemplary embodiments of the inventive concept, there is provided a test apparatus for conducting a package test to a semiconductor package, semiconductor packages, or the like. The test apparatus may include a load port for the semiconductor package, a first test chamber for conducting an electrical test to the semiconductor package, and a second test chamber for selectively conducting a burn-in test to the semiconductor package when no failures are found by the electrical test. The second chamber may include a test compartment that is configured to support and arrange a test board, and/or a plurality of test boards. The test board may be configured to support the semiconductor package, and the test compartment may be further configured to apply a test signal to the semiconductor package. The test compartment has an inlet side and a discharge side opposite the inlet side. The test compartment includes a supply duct that vertically extends in a first direction along a height of the test compartment. The supply duct is in fluid communication with the inlet side of the test compartment, i.e., it allows the flow of fluids such as air, gases, etc. The supply duct may include a fluid controller that uniformly controls a distribution of a test fluid in the supply duct and uniformly controls a supply of the test fluid into the test compartment.

According to exemplary embodiments of the inventive concept, the vertical fluid distribution in the supply duct may be controlled to be uniform by the fluid controller and the diffusion of the test fluid into the surrounding spaces around the board support may be minimized in the test compartment by a fluid resistive block. Therefore, the flow speed of the test fluid may be uniform in the test compartment, and as a result, the test temperature may be uniform in the test compartment. The temperature uniformity in the test compartment may increase the test accuracy in the test chamber.

The fluid controller may cause the vertical distribution of the test fluid to be uniform in the first direction (in spite of the flow inertia) so that when the test fluid may flow into the test compartment, the flow speed of the test fluid may be substantially uniform along the first wall of the test compartment in the first direction. In addition, the test fluid may be prevented from diffusing into the surrounding spaces around the board support and may be controlled to flow only in the board space by the fluid resistive block, thereby increasing the control accuracy to the test fluid in the test compartment. Thus, the test reliability to the test packages may be sufficiently improved by the fluid resistive block.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
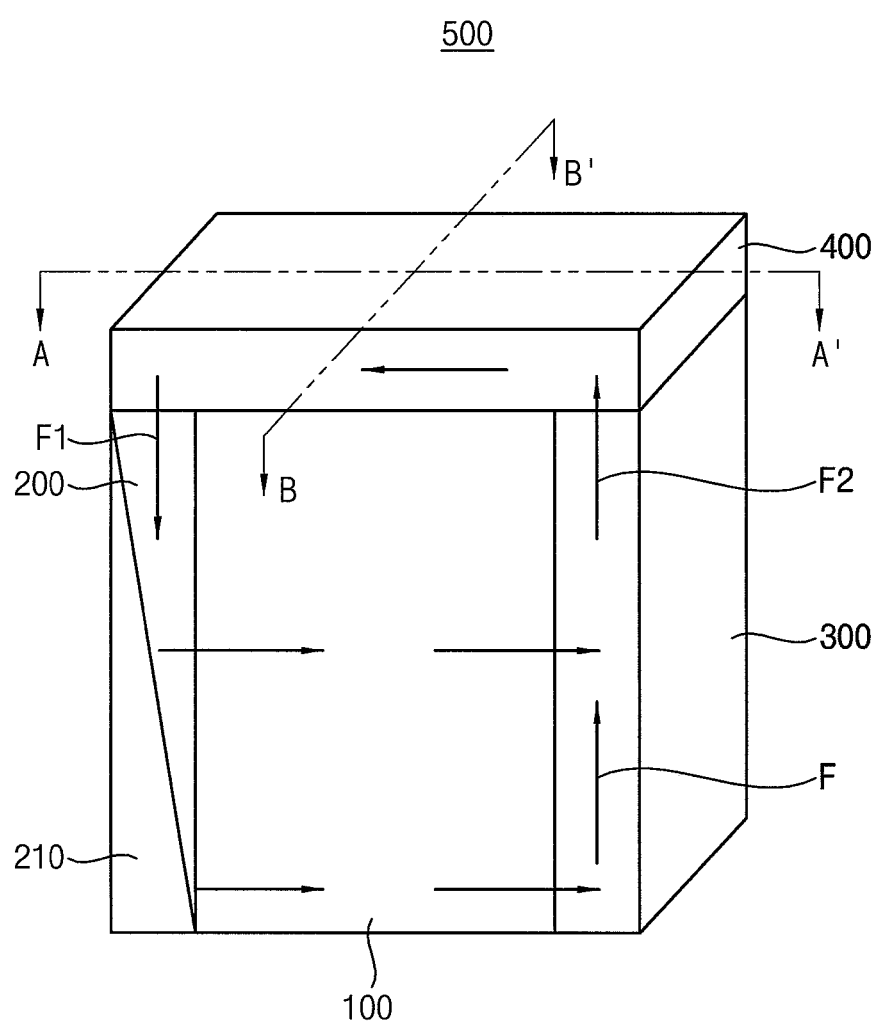
FIG. 1 is a perspective view illustrating a test chamber including a fluid controller in accordance with an example embodiment of the present inventive concept.

Reference will now be made to example embodiments, which are illustrated in the accompanying drawings, wherein like reference numerals may refer to like components throughout. In some instances reference may be made to a single object but the disclosure herein applies equally to plural objects and vice versa, e.g., semiconductor package and semiconductor packages.

Figure 2A:
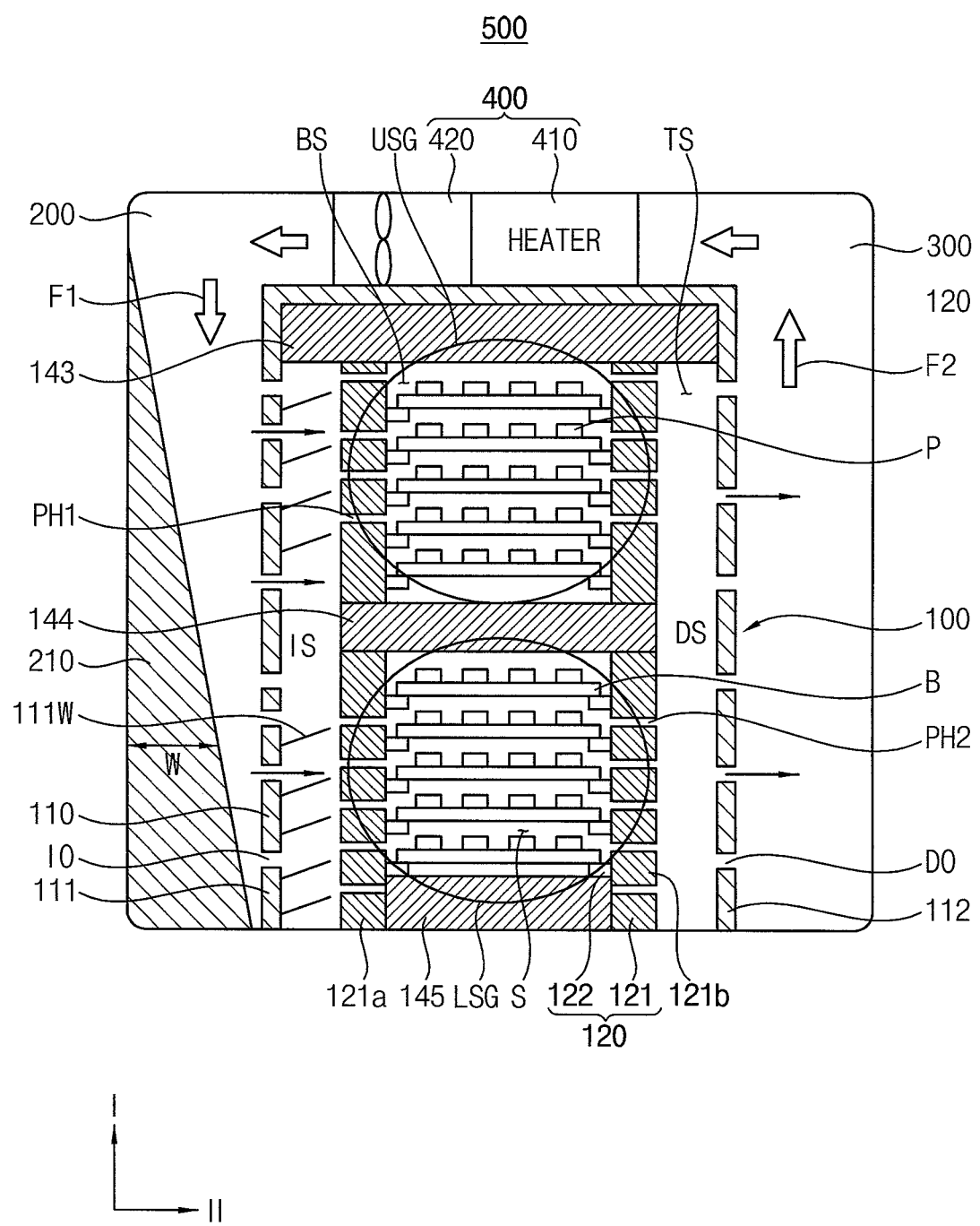
FIG. 2A is a cross sectional view cut along line A-A' of FIG. 1.
Figure 2B:
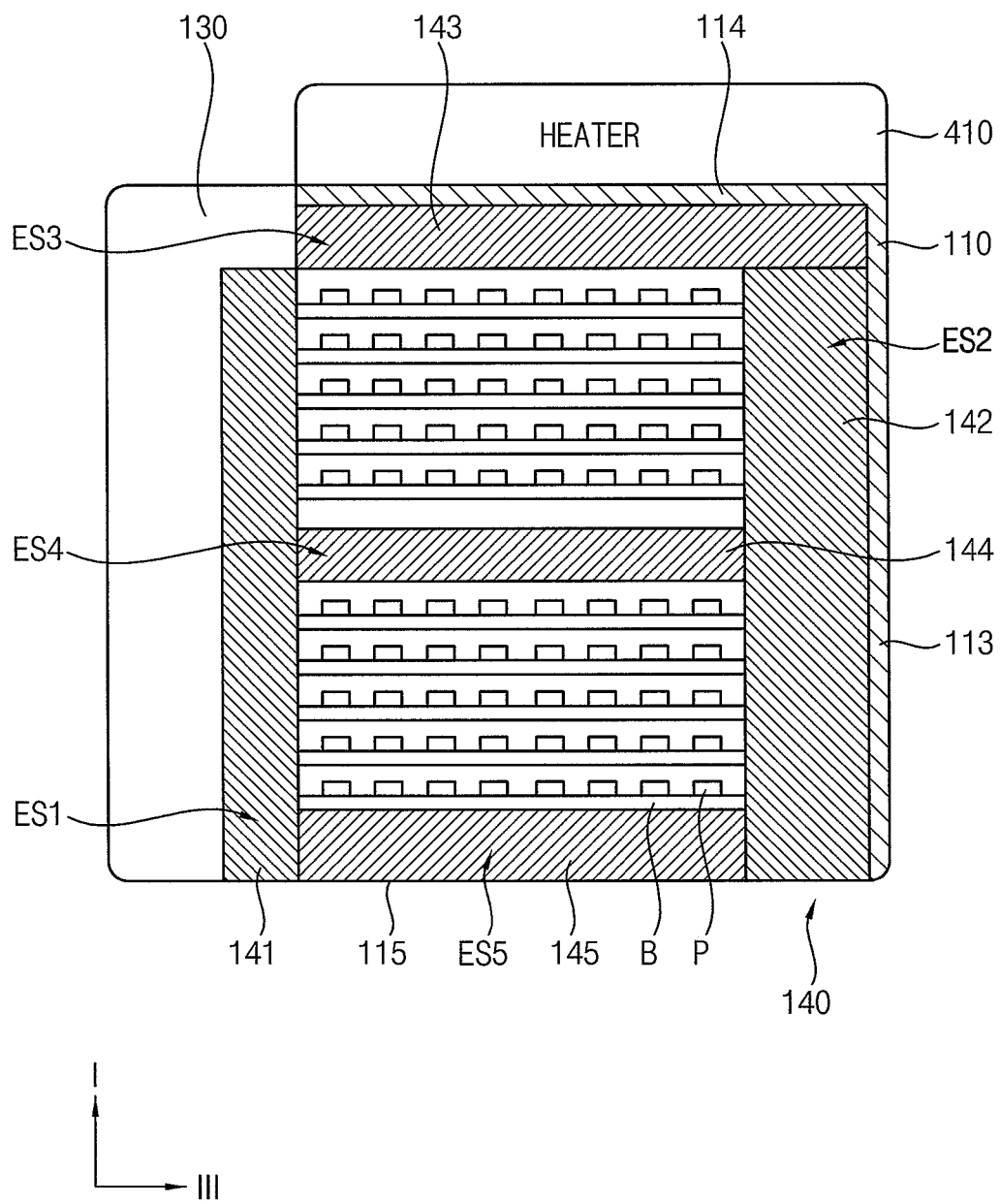
FIG. 2B is a cross sectional view cut along line B-B' of FIG. 1.

FIG. 1 is a perspective view illustrating a test chamber in accordance with an example embodiment of the present inventive concept. FIG. 2A is a cross sectional view cut along line A-A' of FIG. 1 and FIG. 2B is a cross sectional view cut along line B-B' of FIG. 1. Hereinafter, the test chamber 500 may be configured to take the shape of a rectangle having a height and a width. As illustrated, the vertical direction toward the top and bottom of the test chamber 500 is defined as a first direction I (height) and the horizontal direction toward the left side and right side of the test chamber 500 is defined as a second direction II (width). The horizontal direction toward the front side and the rear side of the test chamber 500 is defined as a third direction III.

Referring to FIGS. 1, 2A and 2B, a test chamber 500 in accordance with an example embodiment of the present inventive concept is shown. The test chamber 500 may include a test room 100 (also referred to as a test compartment) that is configured to house, support, arrange, and/or retain a plurality of test objects P (such as semiconductor package(s)). Test chamber 500 may include a supply duct 200 configured to uniformly supply a test fluid F into the test room 100, and an exhaust duct 300 configured to exhaust the test fluid F from the test room 100. Test chamber 500 may also include a fluid circulator 400 circulating the test fluid F along the supply duct 200, the test room 100, and the exhaust duct 300.

In the present example embodiment, the test chamber 500 may include a burn-in test chamber for conducting a burn-in test or a thermal resistance test to semiconductor packages. Thus, the test chamber 500 may be applied to various apparatuses because the thermal resistance test may be applied to the test object under a hot temperature or a cold temperature in the apparatus.

For example, a plurality of test boards B may be provided within the test room 100 and a test object P, and/or plural test objects P, may be secured to each test board B. Then, the test room may apply a test signal to the test object P, and/or the plural test objects P.

As illustrated by the example embodiment of FIG. 2B, a plurality of test objects P are arranged on the test board B in a matrix shape. In the present example embodiment, each test object P may include a semiconductor package (or packages) experiencing various chip manufacturing processes and packaging processes. In some example embodiments, the test object P may be a bare chip and the burn-in test is performed to the bare chip. In addition, numerous other semiconductors and/or electronic devices may also be used as the test object P, e.g., another device tested by the burn-in test. Hereinafter, the test chamber 500 will be described as the burn-in chamber for the semiconductor package(s), and the test object P may be referred to as test package (which may refer to a type of semiconductor package undergoing a test) for ease of explanation and understanding.

A test package P may be inserted into a fixed socket (not shown) of the test board B and may be connected to an electrical circuit pattern in the test board B via the fixed socket. A contact terminal (not shown) connected to the electrical circuit pattern may be provided with the test board B and may be inserted into a contact socket (not shown) that may be provided with sidewalls 110 of the test room 100. A test signal may be applied to the contact socket of the test room 100 and may be transferred to the test package P via the contact terminal and the electrical circuit pattern. For example, the test compart may include a plurality of test probes that are connected to testing equipment. The test compartment may be configured for testing the test board B by utilizing the test probes and/or external or internal electrical testing equipment that is configured to apply a test signal to the contact socket.

For example, the test board B may include a printed circuit board ("PCB") in which a plurality of electric circuit patterns are provided and a plurality of fixed sockets are arranged on a test board B. In this way, a plurality of test packages P may be arranged on a single test board B.

For example, the test room 100 may be configured as a rectangle and an inner space of the rectangle may be provided as a test space TS for the burn-in test. It shall be understood that the term rectangle may be used herein for convenience and ease of understanding and that a rectangular shape in two dimensions may also be referred to as a cuboid in three dimensions. The rectangular test room 100 may include an inlet side IS through which the test fluid F may be supplied into the test room 100 and a discharge side DS through which the test fluid F may be discharged from the test room 100.

For example, the test room 100 may include a plurality of side walls 110 defining the test space TS in such a way that a front side of the test room 100 may be opened and the test space TS may become an open space in fluid communication with the surroundings. The plurality of side walls 110 may include a steel plate having sufficient strength and rigidity to withstand testing conditions. A door 130, as illustrated in FIG. 2B, may be installed to the front side of the test room 100 and may shut or open the test room 100 by rotation or sliding up and down. Thus, the test space TS may become a closed space when the door 130 is closed and become an open space when the door 130 is opened. The test board B may be loaded into the test room 100 or unloaded from the test room 100 through the front side of the test room 100.

In the present example embodiment, the plurality of sidewalls 110 of the test room 100 may include a first sidewall 111 (see FIG. 2A) positioned at the inlet side IS, a second sidewall 112 (see FIG. 2A) positioned at the discharge side DS, a rear sidewall 113 (see FIG. 2B) connected to the first and the second sidewalls 111 and 112 and a ceiling 114 (see FIG. 2B) that is in contact with top surfaces of the first and the second sidewalls 111 and 112 and the rear wall 113. The test space TS may be defined, at least partly, by the first and the second sidewalls 111 and 112 spaced apart from each other in the second direction II, the rear sidewall 113 spaced apart from the door 130 in the third direction III, and the ceiling 114.

For example, the first and the second sidewalls 111 and 112 may each be perforated, e.g., each may have a plurality of openings through which the test fluid F may pass through (to be in fluid communication). Thus, the first sidewall 111 may have a plurality of inlet openings IO (see FIG. 2A) through which the test fluid F may pass into the test space TS and the second wall 112 may have a plurality of discharge openings DO (see FIG. 2A) through which the test fluid F may pass out of the test space TS.

In the example embodiment, a plurality of wind deflectors 111w is arranged on the first sidewall 111 downstream of and adjacent to the inlet openings IO. The wind deflectors 111w are separated from one another by a gap distance that in one example is substantially uniform and corresponds to the spacing between each input opening. In the example embodiment, the gap distance between wind deflectors 111w also corresponds to the pitch between adjacent gaps in vertical plate 121a. Items described as "substantially the same," "substantially equal," or "substantially uniform," may be exactly the same, equal, or uniform, or may be the same, equal, or uniform within acceptable variations that may occur, for example, due to manufacturing processes. The wind deflectors 111w are configured to guide the test fluid into each respective gap in vertical plate 121a, which gap may also be referred to as slots, openings, or holes.

The test board B may be positioned and/or supported on the board support 120 and arranged in the test space TS. For example, the board support 120 may include a pair of vertical plates 121 extending in the first direction I and spaced apart from each other in the second direction II. For example, a pair of vertical plates may include a first vertical plate 121a that is spaced apart from a second vertical plate 121b in the second direction II. In the example embodiment of FIG. 2A, two portions of vertical plates 121a and two portions of vertical plates 121b are separated by buffer block 144. For example, a first pair of vertical plates 121a and 121b may correspond to a lower slot group LSG and a second pair of vertical plates 121a and 121b may correspond to an upper slot group USG with each pair of vertical plates 121a and 121b being separated by a buffer block 144. In other embodiments, the buffer block 144 may be inset and vertical plates 121a and 121b are not separated by buffer block 144. For example, vertical plates 121a and 121b may be continuous for the full height of the test space TS.

Additionally, protrusions 122 may protrude from a surface of the vertical plates 121. For example, a pair of stacked protrusions 122 may protrude from the facing surfaces of vertical plates 121a and 121b, respectively, and may face each other at the same elevation, level, or height. For example, a plurality of protrusions may be stacked along the interior of vertical plates 121a and 121b. Furthermore, the test board B may be supported by the pair of protrusions 122 at the same or similar elevation. A plurality of protrusions 122 may be arranged in the first direction I at the same or similar gap distance. In this example arrangement, the gap distance between adjacent vertically neighboring protrusions 122 may define, at least partly, a slot S (see FIG. 2A) in which the test board B and the test package P may be received. The protrusions 122 may also be described as support bars that connect to and protrude from the surface of the vertical plates 121. The protrusions 122 may be detachably or permanently affixed to the vertical plates 121, and/or may be integrally formed with the vertical plates 121.

Vertical plate 121 may include a steel plate having a sufficient strength to support the plurality of the test boards B and the plurality of the test packages P on each test board B. In the present example embodiment, the vertical plate 121 may include a first plate 121a and a second plate 121b that may be spaced apart from each other in the second direction II. Additionally, first plate 121a may be divided into two portions, at least partially, by buffer block 144. Likewise, second plate 121b may be divided into two portions, at least partially, by buffer block 144. Thus, the test space TS between the first and the second plates 121a and 121b may be provided as a board space BS in which the plurality of the test boards B may be received.

The protrusions 122 may be spaced apart from each other by an equal gap distance in the first direction I and the test board B may be supported by and secured to a pair of protrusions 122 at the same elevation, height, or level.

Thus, the gap space between the vertically neighboring protrusions 122 may be defined as the slot S in which the test board B and the test package P may be received. In the present example embodiment, a test boards B may be installed at each slot S and thus a plurality of test boards B may be stacked in the first direction I in the test room 100.

A plurality of first penetration holes PH1 may be provided vertically along vertical plate 121a on the inlet side IS of the test room 100 to enable fluid communication with each slot S from the inlet side IS. Likewise, a plurality of second penetration holes PH2 may be provided vertically along vertical plate 121b on the discharge side DS of the test room 100 to enable fluid communication with each slot S. Thus, the test fluid F may be supplied into the test room 100 through the inlet opening(s) TO and may flow into the slot(s) S through each of the first penetration holes PH1. Similarly, the test fluid F may flow out of the slot(s) S through each of the second penetration holes PH2 and may be discharged out of the test room 100 through the discharge opening(s) DO.

The test space TS may be closed by the door 130 when conducting the burn-in test. In the example embodiment of FIG. 2B, the door 130 is rotatably secured to the sidewalls 110 at the front side of the test room 100 and the test space TS of the test room 100 may be selectively closed or opened by the door 130. In this example embodiment, the rear sidewall 113 of sidewalls 110 is solid and not perforated like sidewalls 111, 112 shown in FIG. 2A. For example, when the sidewalls 110 collectively form a rectangular or cuboid shape, the first sidewall 111 may be perforated and correspond to the input side with inlet openings IO, the second sidewall 112 opposite of the first sidewall 111 may be perforated and correspond to the output side with discharge openings DO, and the remaining rear sidewall 113 and the ceiling 114 may be solid and continuous without any perforations such as the inlet openings IO and the discharge openings DO. When the door 130 is opened, the test space TS may open to the outside surroundings and test board B may be loaded into the test space TS of the test room 100. When the test board B is loaded into the test room 100, the door 130 may be closed and the test space TS is closed off from the outside surroundings and the burn-in test may be conducted to the test package(s) P on the test board B in the test room 100. After completing the burn-in test in the test room 100, the door 130 may be opened again and the test board B may be unloaded from the test room 100.

The board support 120 may be positioned at a central portion of the test room 100 in such a way that the board support 120 may be spaced apart from the sidewalls 110 and a gap space may be provided between the board support 120 and the sidewalls 110. The gap spaces between the inlet side IS of the test room 100 and the board support 120; and between the discharge side DS of the test room 100 and the board support 120 may be provided as a flow path (fluid communication path) for the test fluid F. In addition, the gap space between the door 130 and the board support 120 may be provided as a front space ES1 and the gap space between the rear wall 113 and the board support 120 may be provided as a rear space ES2. The gap space between the ceiling 114 and the board support 120 may be provided as a ceiling space ES3 and the gap space between a bottom 115 of the test room 100 and the board support 120 may be provided as a bottom space ES5. Accordingly, the board support 120 may be spaced apart from the test room 100 by surrounding spaces ES1, ES2, ES3 and ES5.

In some cases, the test fluid F may flow through the slot S without any diffusion into the surrounding spaces. In other cases, the test fluid F may be diffused into front space ES1, the rear space ES2, the ceiling space ES3 and the bottom space ES5 due to the diffusion characteristics of fluid when the test fluid F may flow in the test space TS.

Thus, an internal flow of the test fluid F may occur between the slot S and the surrounding spaces in the test room 100. The internal flow of the test fluid F can deteriorate the speed uniformity of the test fluid F in the slot S and the control accuracy of the test fluid F in the test room 100. This can cause poor reliability of the burn-in test. In addition, the test efficiency may be deteriorated due to the diffusion of the test fluid F.

In the present example embodiment, a flow resistive block may be provided in the surrounding spaces of the front space ES1, the rear space ES2, the ceiling space ES3, and the bottom space ES5.

For example, the flow resistive block may include a front block 141 that is detachably secured to an inner surface of the door 130 and fills the front space ES1 to thereby prevent the test fluid F from flowing in the front space ES1. Additionally, the flow resistive block may include a rear block 142 filling the rear space ES2 and preventing the test fluid F from flowing in the rear space ES2, a ceiling block 143 filling the ceiling space ES3 and preventing the test fluid F from flowing in the ceiling space ES3, and a bottom block 145 filling the bottom space ES5 and preventing the test fluid F from flowing in the bottom space ES5.

Thus, the test fluid F may be prevented from diffusing into the front space ES1, the rear space ES2, the ceiling space ES3, and the bottom space ES5 in the test room 100; thereby increasing the control accuracy of the test fluid F and the test efficiency.

In the present example embodiment, the board support 120 may be classified into an upper slot group USG (see FIG. 2A) that may be arranged at an upper portion of the test room 100 and a lower slot group LSG (see FIG. 2A) that may be arranged at a lower portion of the test room 100. The lower slot group LSG may be spaced apart from the upper slot group USG by a gap space, so that potential loading/unloading damage of the test board B may be minimized in loading and/or unloading of the test board B. The gap space between the upper slot group USG and the lower slot group LSG may be provided as a buffer space ES4 functioning as a marginal area for design changes of the test chamber 500.

Thus, the test fluid F may also be diffused into the buffer space ES4 (see FIG. 2B) when flowing in the test space TS and the internal flow of the test fluid F may occur between the buffer space ES4 and the upper slot group USG and between the buffer space ES4 and the lower slot group LSG. Non-uniformity of flow of the test fluid F in the test room 100 may occur due to the non-uniform temperature of the test packages P in the board space BS.

To address the above described non-uniform flow, the buffer space ES4 may be filled with a buffer block 144 so as to prevent the test fluid F from flowing in the buffer space ES4. That is, the test fluid F may flow into the upper slot group USG and the lower slot group LSG without any substantial diffusion of the test fluid F in the buffer space ES4, to thereby improve the test efficiency of a burn-in test. For example, test fluid F is prevented from flowing directly between upper slot group USG and lower slot group LSG by buffer block 144.

In addition, the flow resistive block 140 may include adiabatic materials having a sufficiently small coefficient of heat transfer so heat transfer to the surrounding spaces may be prevented and/or minimized by the flow resistive block 140. That is, the heat of the test fluid F may be transferred into the upper slot group USG and the lower slot group LSG without substantial heat loss. Accordingly, the thermal test or the burn-in test to the test package(s) P may be conducted in a relatively shorter time.

The supply duct 200 may extend vertically in the first direction I and may cover and/or fluidly communicate with the first wall 111 at the inlet side IS of the test room 100. The exhaust duct 300 may also extend vertically in the first direction I and may cover and/or fluidly communicate with the second wall 112 at the discharge side DS of the test room 100.

In the example embodiment of FIG. 2A, a supply fluid F1, denoting the test fluid F at the inlet side IS of the test room 100, flows downwards from an upper portion of the supply duct 200 and flows into the test room 100 through the inlet opening IO of the first wall 111. Then, the test fluid F may flow toward the discharge side DS in the test space TS and heat exchange may occur between the test fluid F and the test package P in the test room 100. Thereafter, the test fluid F may flow out of the test space TS through the discharge opening DO of the second wall 112 and may be collected in the discharge duct 300 as a discharge fluid F2 (denoting test fluid F at the discharge side DS of the test room 100). The discharge fluid F2 may be transferred to the fluid circulator 400. Thus, the supply duct 200, the test room 100 and the discharge duct 300 may constitute a circulation path of the test fluid F by the fluid circulator 400.

In a conventional supply duct, test fluid is forced to flow into a supply duct by a fluid circulator. Thus, according to a conventional supply duct, test fluid is forced to flow downwards at the opening of a supply duct and a larger amount of test fluid is supplied to a lower portion than to the upper portion of the conventional supply duct due to flow inertia. Accordingly, the fluid distribution in a vertical direction is biased or skewed toward the lower portion of the supply duct. Because the flow speed of a fluid is usually proportional to the flow amount, the flow speed of a test fluid varies in the vertical direction at the inlet side when the test fluid passes through the first wall 111. For example, a flow speed of a test fluid is relatively higher at the lower portion than the upper portion. That is, the non-uniformity of the vertical fluid distribution in the conventional supply duct generally causes the non-uniformity of the flow speed at the inlet side of the test room.

The present inventive embodiments address the above explained issues of conventional supply ducts by the addition of a fluid controller 210. In example embodiments, a fluid controller 210 is installed to the supply duct 200 for improving the non-uniformity of the vertical fluid distribution. The fluid controller 210 controls the amount of the test fluid F in such a way that the vertical fluid distribution is substantially uniform in the supply duct 200. When the vertical fluid distribution is substantially uniform in the supply duct 200, the flow speed of the test fluid F may also be uniform in the first direction when the test fluid F passes through the first sidewall 111. The uniformity of the flow speed at the inlet side IS causes the temperature of the test package(s) P to be uniform throughout the test room 100.

For example, the fluid controller 210 may be a single slant plate having a width W that increases linearly downwards from the upper portion of the supply duct to the lower portion of the supply duct 200 in the first direction I. For example, the slant plate may be shaped into a prism that may be arranged in the supply duct 200 and be spaced apart from the first sidewall 111 through which the test fluid F may pass. Thus, a surface of the slant plate may be slanted downwards toward the first sidewall 111 and the width W of the slant plate may increase linearly downwards from a top portion to a bottom thereof.

In the example configuration a volume of the supply duct 200 may increase linearly upwards in the supply duct 200. For example, the volume of an upper area of the supply duct 200 is greater than the volume of a lower area of the supply duct 200, and the amount of the test fluid is substantially uniform in the supply duct 200. Thus, the fluid controller 210 may have a flat surface and a linear slope inclining right-downwards with respect to the first sidewall 111 extending in the first direction I.

The linear slope of the slant plate may be varied according to a supply speed of the supply flow F1 that may be determined by an exit force of the fluid circulator 400 and the flow inertia of the test fluid F. In addition, the slope of the slant plate may also be varied by a depth of the supply duct 200 and/or the height of the test room 100.

For example, when the slope change of the slant plate is insufficient for improving the uniformity of the vertical fluid distribution, the slant plate may be modified to be inclined non-linearly (convex or concave) and/or to have a plurality of plate pieces.

Figure 3A:
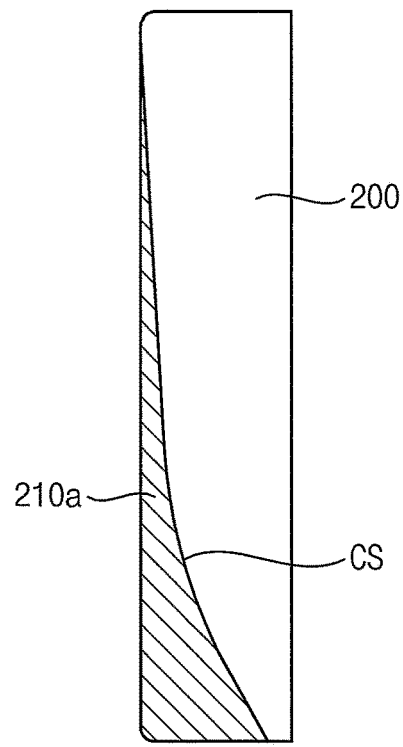
FIG. 3A is an additional example embodiment of a fluid controller similar to the fluid controller shown in FIGS. 1, 2A and 2B.

FIG. 3A is a first modification of the fluid controller shown in FIGS. 1, 2A and 2B and FIG. 3B is a second modification of the fluid controller shown in FIGS. 1, 2A and 2B.

Referring to FIG. 3A, a first modified fluid controller 210a may be a slant plate having a width W that may increase non-linearly downwards from the upper portion of the supply duct 200 to the lower portion of the supply duct 200 in the first direction I. In such a configuration, a volume of the supply duct 200 may increase non-linearly upwards in the supply duct 200. For example, a volume of the supply duct 200 at an upper region may be greater than a volume of the supply duct 200 at a lower region and the amount of the test fluid may be substantially uniform in the supply duct 200. For example, the difference between the two regions may not be linearly correlated, e.g., a parabolic or exponential correlation. Thus, the first modified fluid controller 210a may have a curvilinear surface and a non-linear slope inclining right-downwards curvilinearly with respect to the first wall 111 extending in the first direction I.

For example, when the supply speed of the supply flow F1 and the flow inertia are expressed as a non-linear function or a transcendental function, the fluid controller 210 may be modified to have a non-linear slope in accordance with the instantaneous slope of the non-linear function or the transcendental function in such a way that the vertical fluid distribution may become uniform in the supply duct 200.

In the present example embodiment, the first modified fluid controller 210a may have a concave surface that may be recessed with respect to the first wall 111. In other example embodiments, the first modified fluid controller 210a may have a convex surface according to the supply speed of the supply flow F1 and the flow inertia.

Figure 3B:
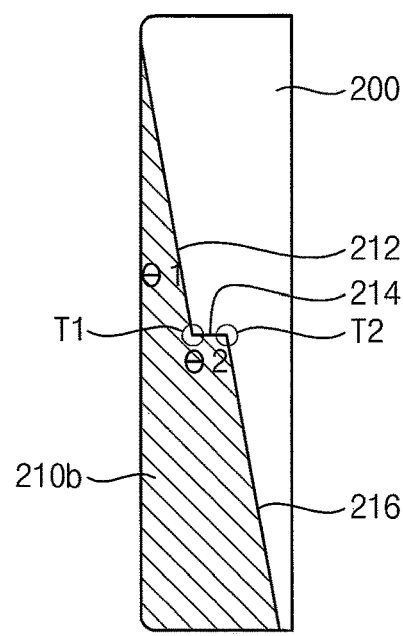
FIG. 3B is an additional example embodiment of a fluid controller similar to the fluid controller shown in FIGS. 1, 2A and 2B.

Referring to FIG. 3B, a second modified fluid controller 210a may be a stepped plate. For example, the stepped plate may include an upper slant plate 212, extending downwards from the upper portion of the supply duct 200 at a first slant angle $\theta 1$, a stepped portion 214 horizontally connected to the upper slant plate 212 in the second direction and a lower slant plate 216 extending downwards from the stepped portion 214 toward a bottom of the supply duct 200 at a second slant angle $\theta 2$. The upper slant plate 212 may extend downwards at the first slant angle $\theta 1$ to the stepped portion 214 and the lower slant plate 216 may extend downwards from the stepped portion 214 at the second slant angle $\theta 2$ to the bottom of the supply duct 200. The first angle $\theta 1$ may be measured from the first direction I and the second angle $\theta 2$ may be measured from the second direction II.

In other example embodiments, the upper slant plate 212 may be linearly sloped at the third slant angle with respect to the inlet side IS of the test room, and the lower slant plate 216 may be linearly sloped at a fourth slant angle with respect to the inlet side IS of the test room. The third slant angle and the fourth slant angle may sum to 360 degrees and the stepped portion 214 may extend horizontally as illustrated by the example embodiment of FIG. 3B.

The connection plate 214 may impede the downstream flow of the supply fluid F1, so the amount of the supply fluid F1 at the lower portion of the supply duct 200 may be lessened and the amount of the supply fluid F1 at the upper portion of the supply duct 200 may be similar to that at the lower portion of the supply duct 200 in spite of the fluid inertia. For example, when the supply fluid F1 may be strongly supplied into the supply duct 200, the supply speed of the supply fluid F1 may be controlled by modifying the shape and angle of connection plate 214.

The second angle θ2 may be varied according to the supply speed of the supply fluid F1. When the second angle θ2 is large with respect to the second direction II, the supply fluid F1 may be strongly impeded from flowing downwards and the connection plate 214 may provide strong impedance to the downstream of the supply fluid F1. In contrast, when the second angle θ2 is small with respect to the second direction II, the supply fluid F1 may be weakly impeded from flowing downwards and the connection plate 214 may function as small impedance to the downstream of the supply fluid F1. Thus, the second angle θ2 may be varied according to the required impedance to the supply fluid F1.

In the present example embodiment, the second angle θ2 may be set about 0° and the connection plate 214 may be arranged horizontally in parallel with the second direction II. The second angle θ2 may also be varied according to the required impedance to the supply fluid F1 and the configurations of the fluid controller 210 may be changed according to the combination of the first and the second angles θ1 and θ2.

The fluid circulator 400 may be arranged on the test room 100 and may be connected or coupled and in fluid communication with the supply duct 200 and the discharge duct 300. The test fluid F may be forced to the supply duct 200 and through the test room 100 by the fluid circulator 400. Then, the test fluid F may be discharged from the test room 100 and collected in the discharge duct 300. The test fluid F in the discharge duct 300 may be forced to flow toward the supply duct 200 by the fluid circulator 400. Thus, the test fluid F may be repeatedly circulated via the supply duct 200, the test room 100 and the discharge duct 300 by the fluid circulator 400.

For example, the fluid circulator 400 may include a temperature controller 410 for controlling the temperature of the test fluid F at a test temperature and a fluid driver 420 for driving the test fluid F to flow toward the supply duct 200 from the discharge duct 300.

For example, the temperature controller 410 may include a heater (not shown) for heating the test fluid F by using an electrical power and transferring a Joule heat to the test fluid F and a cooler (not shown) for cooling the test heat by using a coolant. Various additional heater(s) and cooler(s) may be provided with the temperature controller 410 in addition to the above explained electrical heater and coolant based cooler. Thus, the test fluid F may be maintained in a predetermined temperature range for the thermal test to the test package(s) P in the test room 100.

In the present exemplary embodiment, the test fluid F may include and/or be hot air, e.g., air or another gaseous fluid or gaseous mixture(s) that may be heated to about 150° C. Depending on specific predetermined testing conditions and on the particular embodiment, the test fluid F may include and/or be cold air that may be cooled to about −50° C. In this example, the thermal test may be conducted to the test package(s) P in a temperature range of about −50° C. to about 150° C., although other temperature test ranges are contemplated by this disclosure.

The fluid driver 420 may be positioned on the same fluid path with the temperature controller 410. When the test fluid F is heated and/or cooled to the appropriate test temperature by the temperature controller 410, the test fluid F may then be driven to flow into the supply duct 200. For example, the fluid driver 420 may include an air blower for blowing the test fluid F toward the supply duct 200. Thus, the test fluid F under the test temperature may be forced to flow into the supply duct 200 with some flow inertia as the supply fluid F1.

In the present example embodiment, hot air of about 150° C. may flow into the test room 100 as the supply fluid F1 and may burn or heat the test package(s) P in the slot S by heat exchange between the hot air and the test package(s) P. Thereafter, the thermal resistance of each test package(s) P may be checked and/or determined by the burn-in test. When completing the burn-in test in the test room 100, the hot air may be discharged into the discharge duct 300 as the discharge fluid F2.

The discharge fluid F2 may be driven to flow into the temperature controller 410 and the temperature of the discharge fluid F2 may be restored to the original test temperature (in this example, 150° C.). Alternatively, when the temperature of the discharge fluid F2 is greater than or less than the test temperature, the temperature controller 410 may not apply any thermodynamic work to the discharge fluid F2 and the discharge fluid F2 may pass through the temperature controller 410 without any heat exchanges. Additionally, when the temperature of the discharge fluid F2 is greater than or less than the test temperature, the discharge fluid F2 may not flow into the temperature controller 410 and may directly flow into the fluid driver 420. Whether discharge fluid F2 is heated or cooled may be a variable of predetermined testing conditions as would be applicable to the type of test package P.

In some example embodiments, an additional driver (not shown) may be further provided with the fluid circulator 400 for lifting the discharge fluid F2 to the fluid circulator 400 from the discharge duct 300. For example, the additional driver may include a vacuum generator for applying a vacuum pressure to the discharge duct 300.

Therefore, the fluid circulator 400 may set the test fluid F to a predetermined temperature by heating or cooling the discharge fluid F2, forcing the test fluid F into the supply duct 200 (possibly with some flow inertia) as the supply fluid F1 and drive the discharge fluid F2 to the temperature controller 410. The supply and collection of the test fluid F may be repeated along the supply duct 200, the test room 100 and the discharge duct 300 by the fluid circulator 400.

According to the example embodiment, the vertical fluid distribution in the supply duct 200 may be controlled to be uniform by the fluid controller 210 and the diffusion of the test fluid into the surrounding spaces around the board support 120 may be minimized in the test room 100 by the fluid resistive block 140. Therefore, the flow speed of the test fluid F may be uniform in the test room 100, and as a result, the test temperature may be uniform in the test room 100. The temperature uniformity in the test room 100 may increase the test accuracy in the test chamber 500.

The fluid controller 210 may make the vertical distribution of the test fluid uniform in the first direction I in spite of the flow inertia, so when the test fluid F flows into the test room 100, the flow speed of the test fluid F may be substantially uniform along the first wall of the test room in the first direction I.

In addition, the test fluid F may be prevented from diffusing into the surrounding spaces around the board support 120 and may be controlled to flow only in the board space BS by the fluid resistive block 140, thereby increasing the control accuracy to the test fluid F in the test room 100. Thus, the test reliability to the test packages P may be improved by the fluid resistive block 140.

Figure 4:
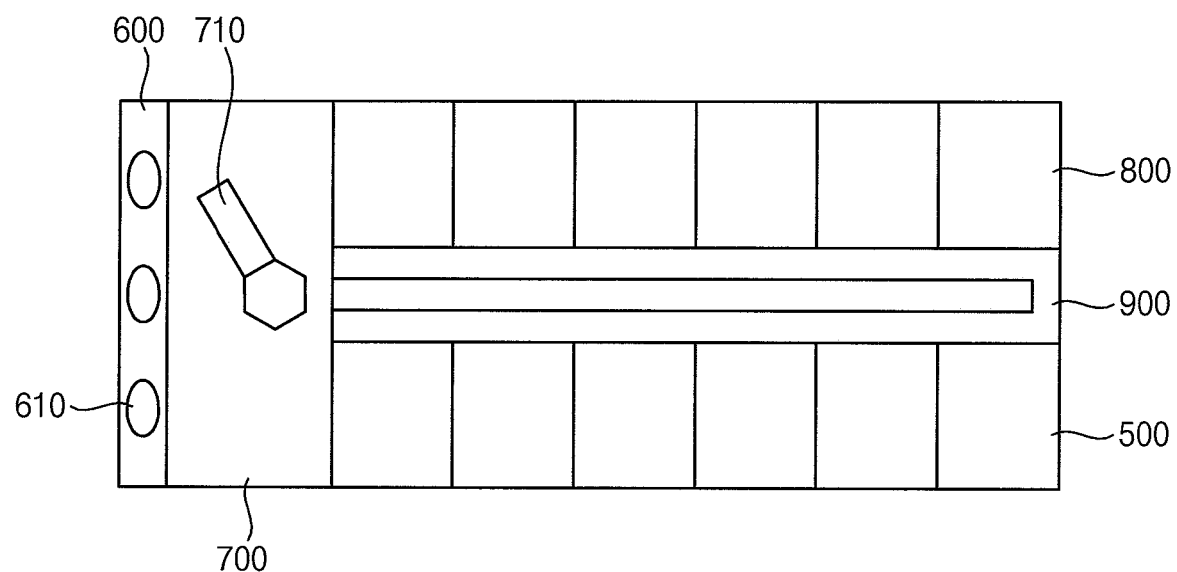
FIG. 4 is an example embodiment of a test apparatus having a test chamber similar to the test chamber shown in FIGS. 1, 2A and 2B in accordance with the present inventive concept.

FIG. 4 is a structural view illustrating a test apparatus having the test chamber shown in FIGS. 1, 2A and 2B in accordance with example embodiments of the present inventive concept. In addition, in FIG. 4, the same reference numerals denote similar elements as that of FIGS. 1, 2A and 2B. In FIG. 4, a semiconductor package(s) 'P', (not illustrated in FIG. 4; see FIGS. 1, 2A and 2B) is tested. Any other devices as well as the semiconductor package(s) may also be tested by the test apparatus, e.g., when a thermal resistance test is conducted to the device.

Referring to FIG. 4, a test apparatus 1000 in accordance with the example embodiments of the present inventive concept is shown. The test apparatus 1000 may include a load port 600 at which a plurality of semiconductor packages P may be on standby (waiting for loading and/or unloading), a first transfer station 700 for picking up and transferring the semiconductor packages P from the load port 600, a first test chamber 800 for conducting an electrical test to the semiconductor package(s) P, and a second test chamber 500 for conducting a burn-in test to the semiconductor package(s) P after it is transferred from the first test chamber 800 in the event no failures are found in the semiconductor package(s) P during the electrical test.

The load port 600 may receive a transfer unit (not shown) such as a package box or magazine that holds a plurality of semiconductor packages P. For example, a plurality of ports 610 may be provided with the load port 600, so that a plurality of the package boxes or magazines may be positioned on the load port 600. For example, when a semiconductor device, such as a wafer holding a plurality of semiconductor chips, may be tested in the test apparatus 1000, a wafer cassette may also be positioned on the load port 600. Thus, the transfer unit may be varied according to the specific test object.

When the package box or the magazine is located on the load port 600, a robot arm 710 of the first transfer station 700 may pick up the semiconductor package(s) P from the package box or the magazine and transfer the semiconductor package(s) P to the second transfer station 900. Second transfer station 900 may include a conveyor and/or a robotic arm.

Then, the semiconductor package(s) P may be loaded in the first test chamber 800 by the second transfer station 900 and an electrical test, such as a direct current (DC) test for example, may be performed on the semiconductor package(s) P in the first test chamber 800. The first test chamber 800 may have the same or similar structure as a conventional DC test chamber, so any further detailed descriptions on the first test chamber 800 will be omitted hereinafter.

When a failure is found in the semiconductor package(s) P during the electrical test, the semiconductor package(s) P may be transferred to the first transfer station 700. The first transfer station 700 may transfer the defective semiconductor package(s) P to a failure deck (not shown). When no failures are found in the semiconductor package(s) P in the electrical test, the semiconductor package(s) P may be loaded into the second test chamber 500 by the second transfer station 900. Thereafter, a thermal test, such as a burn-in test for example, may be conducted to the semiconductor package(s) in the second test chamber 500.

In the example embodiment of FIG. 4, the second test chamber 500 may have substantially the same structures as the test chamber 500 described in detail with references to FIGS. 1, 2A and 2B, hereinabove. Test room 100 may be configured for holding at least a test board B on which the semiconductor package P is secured. Additionally, test room 100 may be configured to apply a test signal to the semiconductor package P. A supply duct 200 may vertically extend in the first direction I along a height of the test room 100 such that an inlet side IS of the test room 100 may be covered by the supply duct 200. The test room 100 may include the inlet side IS and the discharge side DS opposite to the inlet side IS and the supply duct may include a fluid controller 210 that may control a distribution uniformity of a test fluid in the supply duct 200 and cause the test fluid F to be uniformly supplied into the test room 100.

For example, the test room 100 may include a plurality of rectangular perforated sidewalls 110 by which a test space TS may be defined. The perforated sidewalls 110 may be in fluid communication with the supply duct 200 at the inlet side IS. A board support 120 may extend in the first direction I and support the test boards B such that the test boards B may be arranged in the first direction I at the same interval. A slot S may be provided between neighboring test boards B, and a door 130 may be rotatably secured to the sidewall 110 and configured for selectively opening the test space TS such that the semiconductor package P may be loaded into or unloaded from the test room 100. The test room may also include a flow resistive block 140 configured for filling a surrounding space around the board support 120 such that the test fluid F may be blocked from flowing in the surrounding space.

For example, the fluid controller 210 may include a slant plate having a width W that may increase downwards from an upper portion of the supply duct 200 to a lower portion of the supply duct 200 in the first direction I such that an interior volume of the supply duct 200 varies. For example, the volume of the supply duct 200 may increase upwards in the supply duct 200 and an amount of the test fluid F may be substantially uniform in the supply duct 200.

The fluid controller 210 may cause the vertical distribution of the test fluid to be uniform in the first direction I in spite of the flow inertia, so that when the test fluid F may flow into the test room 100, the flow speed of the test fluid F may be substantially uniform along the first wall of the test room in the first direction I. In addition, the test fluid F may be prevented from diffusing into the surrounding spaces around the board support 120 and may be controlled to flow only in the board space BS by the fluid resistive block 140, thereby increasing the control accuracy to the test fluid F in the test room 100. Thus, the test reliability to the test packages P may be improved by the fluid resistive block 140.

The second test chamber 500 may have substantially the same structures as the test chamber 500 described in detail with references to FIGS. 1, 2A and 2B, thus any further detailed descriptions on the second test chamber will be omitted.

When a failure is found in the semiconductor package(s) P during the burn-in test (at the second test chamber 500), the semiconductor package(s) P may be transferred to the first transfer station 700. The first transfer station 700 may transfer the defective semiconductor package(s) P to a failure deck (not shown). When no failures are found in the semiconductor package(s) P in the burn-in test, the semiconductor package(s) P may be transferred to a non-failure deck (not shown). The failure deck and the non-failure deck may be positioned on the load port 600.

Accordingly, the electrical test and the burn-in test may be sequentially conducted to the semiconductor package(s) P in the test apparatus 1000. Additionally, an electrical test and a burn-in test may be performed simultaneously, but for different semiconductor package(s) proceeding in sequence through the test apparatus 1000.

Figure 5:
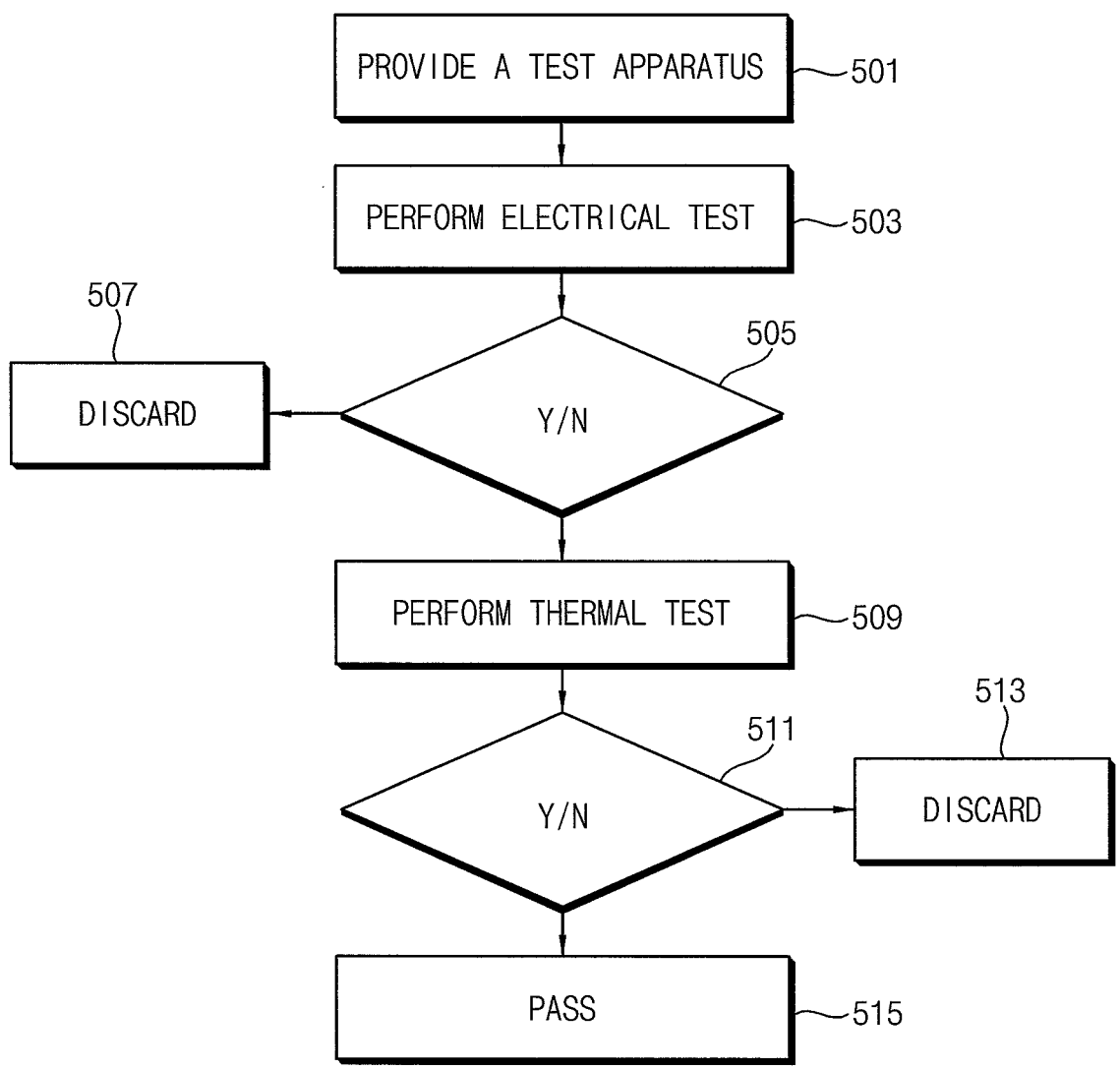
FIG. 5 is a flow chart showing a method of manufacturing a semiconductor device, in accordance with some embodiments.

FIG. 5 discloses an example method for performing a reliability test of a semiconductor package using, e.g., a test apparatus similar to the above described embodiments. First, a test apparatus and a test chamber for supporting a semiconductor or plural semiconductors is provided at step 501. At step 503, an electrical test may be performed to the semiconductor. Next, at step 505, a conditional analysis is performed as to whether the semiconductor passed the electrical test (Yes) and advances to the thermal test step 509 or fails the electrical test (No) and is discarded at step 507. After performing the thermal test 509, a conditional analysis step 511 is performed as to whether the semiconductor passed the thermal test (Yes) and advances to the pass step 515 for further processing or sale or fails the thermal test (No) and is discarded at step 513. After the semiconductor or semiconductors pass the above explained reliability test they may be further packaged, bundled, or assembled with other electronic devices and mechanical devices. In some instances, the method may perform a statistical quality assurance in that each semiconductor is not specifically tested but a portion of a manufacturing batch of semiconductors is tested. For example, a batch of semiconductors is assigned a reliability probability based on the results of the individual test results of the specifically tested semiconductors of the batch of semiconductors. Particularly, the test temperature may be controlled uniformly in the second test chamber 500 and the diffusion of the test fluid may be minimized in the second test chamber 500, thereby increasing the control accuracy to the test fluid and the test reliability.

According to the example embodiments of the present inventive concept, the vertical fluid distribution in the supply duct may be controlled to be uniform by the fluid controller and the diffusion of the test fluid into the surrounding spaces around the board support may be minimized in the test room by the fluid resistive block. Therefore, the flow speed of the test fluid may be uniform in the test room, and as a result, the test temperature may be uniform in the test room. The temperature uniformity in the test room may increase the test accuracy in the test chamber.

The fluid controller may make the vertical distribution of the test fluid uniform in the first direction in spite of the flow inertia, so when the test fluid may flow into the test room, the flow speed of the test fluid may be substantially uniform along the first wall of the test room in the first direction.

In addition, the test fluid may be prevented from diffusing into the surrounding spaces around the board support and may be controlled to flow just in the board space by the fluid resistive block, thereby increasing the control accuracy to the test fluid in the test room. Thus, the test reliability to the test packages may be sufficiently improved by the fluid resistive block.

The foregoing is illustrative of example embodiments and is not to be construed as limiting thereof. Those skilled in the art will readily appreciate that many modifications to the example embodiments are possible without materially departing from the novel and non-obvious teachings and advantages of the present invention. Accordingly, all such modifications are intended to be included within the scope of the present invention as defined in the claims. In the claims, means-plus-function clauses are intended to cover the structures described herein as performing the recited function in addition to structural equivalents and equivalent structures. Therefore, it is to be understood that the foregoing disclosure is illustrative only and is not to be construed as limited to the specifically disclosed embodiments.

What is claimed is:

1. A test chamber comprising:
   a test compartment configured to support and arrange a plurality of test boards, each test board being configured to secure a test object and receive a test signal, the test compartment having an inlet side and a discharge side opposite the inlet side;
   a supply duct vertically extending in a first direction along a height of the test compartment, the supply duct being configured to supply the inlet side of the test compartment with a test fluid;
   a fluid controller that is configured to control a distribution uniformity of the test fluid in the supply duct and uniformly supply the test compartment with the test fluid;
   a board support that extends in the first direction, the board support being configured to support and arrange the test boards in the first direction at substantially the same intervals, wherein a slotted space is provided between neighboring test boards; and
   a flow resistive block that is configured to fill a surrounding space around the board support and block the test fluid from flowing into the surrounding space.

2. The test chamber of claim 1, wherein the fluid controller includes a slant plate having a variable width that increases in a downwards direction from an upper portion of the supply duct to a lower portion of the supply duct,
   wherein a volume of an upper area of the supply duct is greater than the volume of a lower area of the supply duct and an amount of the test fluid is substantially uniform in the supply duct.

3. The test chamber of claim 2, wherein the slant plate is linearly slanted with respect to the inlet side of the test compartment.

4. The test chamber of claim 2, wherein the slant plate includes an upper plate extending downwards from an upper portion of the supply duct at a first slant angle with respect to the first direction, a stepped portion horizontally connected to the upper plate in a second direction perpendicular to the first direction and a lower plate extending downwards from the stepped portion toward a bottom of the supply duct at a second slant angle with respect to the second direction.

5. The test chamber of claim 1, wherein the test compartment includes:
   a plurality of perforated sidewalls, the perforated sidewalls define, at least partly, a test space and are configured to communicate with the inlet side of the supply duct; and
   a rotatable door configured to selectively open and close the test space when the test object is loaded into the test compartment or unloaded from the test compartment.

6. The test chamber of claim 1, wherein the board support includes a pair of vertical plates that are arranged in the first direction and spaced apart from each other in a second direction perpendicular to the first direction, and
   wherein each slotted space includes a penetration hole that is configured to provide a flow path of the test fluid.

7. The test chamber of claim 6, further comprising a plurality of wind deflectors arranged on a sidewall of the test compartment adjacent to the supply duct,
wherein the wind deflectors are separated from one another by a gap distance in the first direction,
wherein the gap distance between respective wind deflectors of the plurality of wind deflectors is substantially equal and corresponds to the distance of each slot, and
wherein the test fluid is guided into each respective slot by a corresponding wind deflector.

8. The test chamber of claim 5, wherein the flow resistive block includes a front block detachably secured to an inner surface of the rotatable door that fills a front space of the surrounding space between the rotatable door and the board support,
wherein the front block is configured to prevent the test fluid from flowing into the front space.

9. The test chamber of claim 1, wherein the board support includes a group of upper slots disposed at an upper portion of the test compartment and a group of lower slots disposed at a lower portion of the test compartment and spaced apart from the group of upper slots by a buffer space,
wherein the flow resistive block includes a buffer block that fills the buffer space between the group of upper slots and the group of lower slots, and
wherein the buffer block is configured to prevent the test fluid from flowing into the buffer space.

10. The test chamber of claim 5, wherein the flow resistive block includes a rear block that fills a rear space of the surrounding space between the board support and a rear sidewall of the test compartment opposite to the rotatable door,
wherein the rear block is configured to prevent the test fluid from flowing into the rear space.

11. The test chamber of claim 1, wherein the flow resistive block includes a ceiling block that fills a ceiling space of the surrounding space between the board support and a ceiling of the test compartment,
wherein the ceiling block is configured to prevent the test fluid from flowing in the ceiling space.

12. The test chamber of claim 1, further comprising:
an exhaust duct vertically extending in the first direction and being in fluid communication with the discharge side of the test compartment, the exhaust duct being configured to exhaust the test fluid from the test compartment; and
a fluid circulator in fluid communication with both of the supply duct and the exhaust duct, the fluid circulator being configured to circulate the test fluid via the supply duct, the test compartment, and the exhaust duct.

13. The test chamber of claim 12, wherein the fluid circulator includes a temperature controller configured to control the temperature of the test fluid.

14. The test chamber of claim 13, wherein the fluid circulator includes a fluid driver configured to drive the test fluid toward the supply duct from the exhaust duct.

15. The test chamber of claim 2, wherein the slant plate is curvilinearly sloped with respect to the inlet side of the test compartment.

16. The test chamber of claim 2, wherein the slant plate includes an upper plate, a lower plate, and a stepped portion that connects the upper plate to the lower plate,
wherein the upper plate is linearly sloped at an angle with respect to the inlet side of the test compartment, and the lower plate is linearly sloped at another angle with respect to the inlet side of the test compartment.

17. A test apparatus for conducting a package test to a semiconductor package, the test apparatus comprising:
a load port for the semiconductor package;
a first test chamber for conducting an electrical test to the semiconductor package; and
a second test chamber for selectively conducting a burn-in test to the semiconductor package when no failures are found by the electrical test,
wherein the second test chamber comprises:
a test compartment configured to support and arrange a test board, the test board being configured to support the semiconductor package and apply a test signal to the semiconductor package, the test compartment having an inlet side with a plurality of input openings and a discharge side with a plurality of discharge openings opposite the inlet side;
a supply duct vertically extending in a first direction along a height of the test compartment and being in fluid communication with the inlet side of the test compartment, the supply duct including a fluid controller that controls a distribution of a test fluid in the supply duct and controls a supply of the test fluid into the test compartment to be uniformly input to the test compartment at each input opening;
a board support that extends in the first direction, the board support being configured to support and arrange the test boards in the first direction at substantially the same intervals, wherein a slot is provided between neighboring test boards; and
a flow resistive block that is configured to fill a surrounding space around the board support and block the test fluid from flowing into the surrounding space.

18. The test apparatus of claim 17, wherein the fluid controller includes a slant plate that defines a width of the fluid controller,
wherein the width is variable and increases in a downwards direction beginning from an upper portion of the supply duct to a lower portion of the supply duct, and
wherein an amount of the test fluid is substantially uniform in the supply duct.

19. The test apparatus of claim 18, wherein the test compartment includes:
a plurality of perforated side walls that define a test space, the perforated side walls being in fluid communication with the supply duct at the inlet side; and
a rotatable door that is configured to selectively open and close the test space when the semiconductor package is loaded into the test compartment or unloaded from the test compartment.

20. The test apparatus of claim 18, wherein the slant plate is curvilinearly sloped with respect to the inlet side of the test compartment.

* * * * *